United States Patent
Eaton, Jr.

[11] Patent Number: 5,317,538
[45] Date of Patent: May 31, 1994

[54] LOW POWER DRAM

[75] Inventor: S. Sheffield Eaton, Jr., Colorado Springs, Colo.

[73] Assignee: United Memories, Inc., Colorado Springs, Colo.

[21] Appl. No.: 859,670

[22] Filed: Mar. 30, 1992

[51] Int. Cl.$^5$ ............................................. G11C 5/14
[52] U.S. Cl. .......................... 365/189.09; 365/189.07; 365/226
[58] Field of Search ............. 365/149, 189.09, 189.07, 365/226, 227, 222, 205, 207, 208; 307/296.6

[56] References Cited

U.S. PATENT DOCUMENTS 4,506,351 3/1985 Scheuerlein et al. ............ 365/149 X Primary Examiner—Joseph A. Popek
Attorney, Agent, or Firm—Edward D. Manzo

[57] ABSTRACT

In a DRAM, a logic "1" is redefined as the minimum VCC value minus one threshold voltage. The word line is not bootstrapped. This intermediate voltage is applied via the sense amplifier to the bit lines during refresh. The intermediate value is controlled preferably by a comparator controlling a driver. Even when the power supply voltage rises, the intermediate voltage is held constant by comparison to a fixed reference voltage. Operating current is substantially reduced because less power is required to write data into the memory cells, since a controlled lower voltage is used.

17 Claims, 1 Drawing Sheet

LOW POWER DRAM

FIELD OF THE INVENTION

The present invention relates to dynamic random access memories ("DRAMs") and particularly to power consumption in large scale DRAMs occasioned by refreshing and other activities in the DRAM.

DESCRIPTION OF PRIOR ART

This invention relates to the field of integrated circuit memories. It relates especially to DRAMs but may find application in other memories. DRAMs include a plurality of bit lines organized parallel to each other, orthogonal to a plurality of word lines. Memory cells are usually disposed at or near the intersections of the bit lines and the word lines. In a DRAM, and with reference to FIG. 1, a memory cell typically includes an access transistor 12 such as a field effect transistor, having one of its terminals coupled to a bit line 14 and its control electrode (gate electrode) coupled to a word line 16. Another electrode of the transistor is coupled to a storage capacitor 18. That is to say, one plate of the capacitor is coupled to the transistor and the other plate of the capacitor is coupled to ground ("VSS") or to some voltage other than ground, such as the power supply voltage ("VCC") or an intermediate voltage such as $\frac{1}{2}$ VCC. Bit line 14 will normally have a plurality of memory cells disposed along it, each corresponding to a word line, and for clarity of illustration, only one memory cell has been illustrated for bit line 14, although many are in fact present.

A complementary bit line 14' is paired with bit line 14 and similarly has a transistor 12' and a capacitor 18'. The control electrode (gate electrode) of transistor 12' is coupled to a word line 20 distinct from word line 16, although in some memories it may be coupled to the same word line. For clarity of illustration, only one memory cell is illustrated along bit line 14', but it will be understood that both bit lines 14 and 14' have a plurality of memory cells disposed therealong.

Bit lines 14 and 14' are coupled to a sense amplifier 22 which illustratively comprises a pair of cross coupled p channel and n channel transistors. FIG. 1 is representative and does not show the output from the sense amplifier or other connections to it, such as the input/output buffer or other circuitry. To the extent described so far, this represents (part of) a customary DRAM design.

This design has been used for many years. However, with rising DRAM densities, more and more memory cells are being added to the bit lines, and the total capacitance of the bit lines rises.

The storage capacitors 18 and 18' are also volatile. That is to say, charge stored on them tends to leak away. For this reason, DRAMs are refreshed many times per second by reading the data stored within the memory cells and rewriting them into the memory cells at full (restored or refreshed) voltages. The memory cells must be read before the voltages or charge stored on the capacitors have decayed to zero, at which point the data will be lost.

Generally, in order to refresh or write into the memory cells, the bit lines must be moved between VCC and VSS. With ever increasing DRAM capacity, one solution to having to move this huge capacitance between VSS and VCC is to move part of it at once. That is to say, in a four megabit DRAM, only $\frac{1}{4}$ of the bit lines might be refreshed at once. Nevertheless, this still requires a large amount of power.

This problem is exacerbated with variations in VCC. A memory will have specified operating ranges. For example, it may well have to perform between a power supply voltage of 4.5 volts and 5.5 volts illustratively as minimum and maximum ranges of VCC. The VCC is applied to one pin of the packaged chip, from an external source. As VCC rises toward its maximum, the current and thus the power required for the refresh operations increases as shown by a curve 30 in FIG. 2. It can be seen that a sizable increase in power is required by prior art configurations.

Another important factor in DRAM design is the loss of signal due to the inherent threshold voltage drop across the memory cell access transistor during the write operation. Typically, the prior art has dealt with this problem by bootstrapping the word lines to a higher voltage so that a full VCC value can be written into the cell. That is to say, when the word line is bootstrapped to a voltage higher than VCC, it turns on transistor 12 even harder, thereby coupling the full amount of the voltage on bit line 14 to the upper plate of capacitor 18. This presents a further problem of having to provide bootstrap drivers and generating higher voltages, which also leads to higher power.

The object of the present invention, therefore, is to overcome the problem of large capacitance associated with the bit lines.

An object of the invention is to avoid using ever increasing amounts of power for refresh operations as the power supply voltage increases.

Another object of this invention is to reduce the power consumption for refresh operations or writing operations even at the power supply minimum specified voltage.

SUMMARY OF THE INVENTION

According to various aspects of the present invention, the problems mentioned above are solved by redefining the voltage that represents logic "1" within the memory cell. The voltage is lower than VCC, preferably by one transistor threshold voltage.

Another aspect of the invention is to limit the voltage to which the bit lines are driven in refresh operations. Preferably this is accomplished by combining a comparator with a driver and a reference voltage, so that a latch signal applied to the sense amplifier is prevented from rising above the preferred voltage.

BRIEF DESCRIPTION OF THE DRAWINGS

In describing the present invention, reference is made to accompanying drawings wherein.

DESCRIPTION OF THE PREFERRED EMBODIMENT

Figure 1:
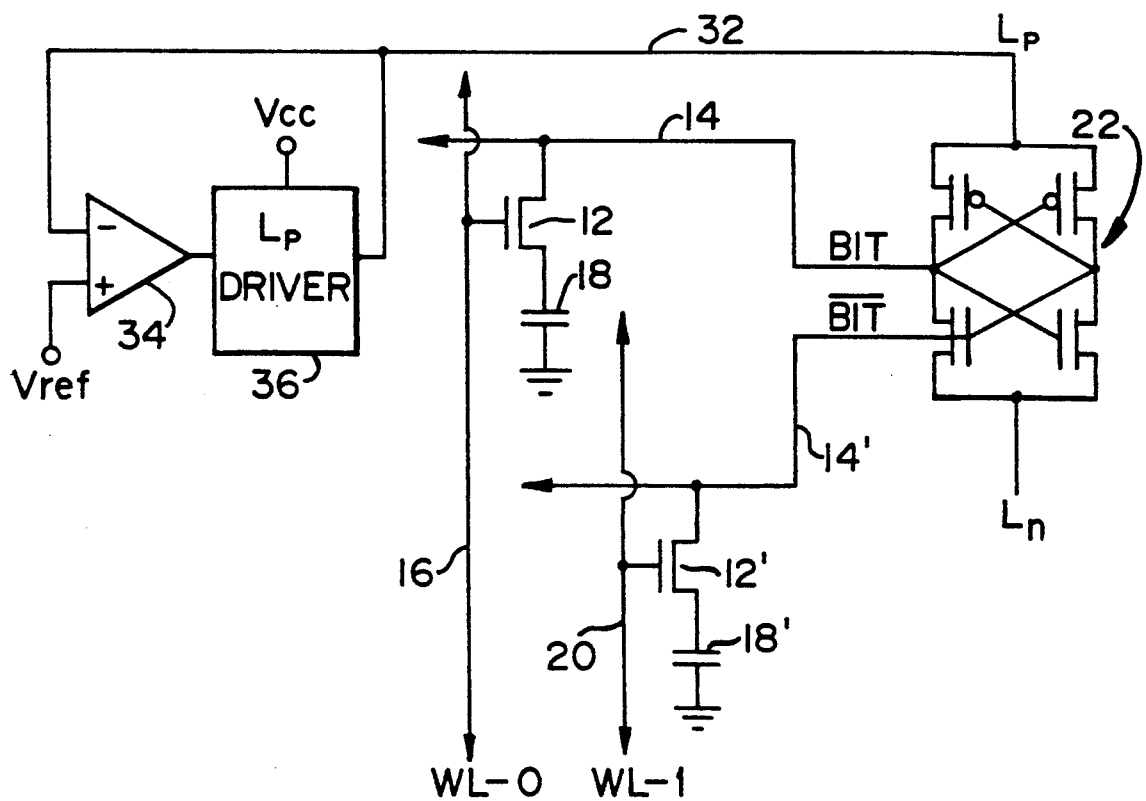
FIG. 1 illustrates a configuration according to the preferred embodiment of the present invention.

FIG. 1 illustrates a configuration of a memory cell and column circuitry according to the present invention. As described above, not all of the memory cells are illustrated, thereby promoting clarity of the illustration. It will be understood, however, that this invention applies to an entire array of memory cells, preferably DRAM memory cells. Thus, it will be understood that a large number of word lines and a large number of bit lines have memory cells disposed at or near intersections thereof. A plurality of sense amplifiers are provided, each corresponding to a bit line pair.

Illustratively, transistors 12 and 12' are shown as N channel enhancement mode transistors coupled to storage capacitors 18 and 18' respectively. It will be understood that other types of transistors can be used, or other switching devices. The present invention is not confined to the use of N channel field effect transistors as access transistors.

Assume for illustrative purposes that the n-channel threshold voltage is approximately 1.2 volts. If the power supply minimum voltage is specified at 4.5 volts, then by subtracting the threshold voltage therefrom, this leaves 3.3 volts available to store data. According to an aspect of the present invention, in the preferred embodiment where 4.5 volts is the minimum VCC, and 1.2 volts is the threshold voltage, 3.3 volts is defined as a logic "1". Further, the word line preferably is not bootstrapped.

Thus, the voltage for a logic "1" (or for a logic "0") generally corresponds to the value of the minimum VCC minus one threshold voltage. In the present example, this is 3.3 volts, as mentioned. During restore operations, 3.3 volts is written into the memory cell for a logic "1".

When the memory (chip) is in a different ambient state, or other condition which causes VCC to rise to its maximum specification, such as 5.5 volts illustratively, the circuit is configured and operates in the following way. Normally, the signal on a line 32, which we refer to as LATCH-P, is at the VCC value. LATCH-P may sometimes have a value of 0, as when the sense amplifier is not turned on. The value of LATCH-P is coupled through the P channel transistors of sense amplifier 22 and drives the bit lines to the voltage value of LATCH-P. In the preferred embodiment the value of LATCH-P applied to line 32 is limited to 3.3 volts, which is the difference between VCC at the minimum power supply specification and one voltage threshold. Thus, independent of rises in VCC, the bit line voltage is limited to 3.3 volts in the preferred embodiment. Even when VCC is at its maximum, the bit line is not permitted to rise as far as VCC during refresh operations; nor ideally may it rise above $Vcc_{min} - V_t$.

This is achieved by configuring a circuit to provide LATCH-P. This circuit includes a comparator 34 and a driver 36. Comparator 34 is coupled to both the input and the output of driver 36 in a feedback loop. Another input of comparator 34 receives a reference voltage Vref. The reference voltage is generated by a circuit such as is illustrated and described fully in U.S. Ser. No. 07/644,904 filed Jan. 23, 1991, now U.S. Pat. No. 5,117,177, and applications referenced therein, the disclosures of which are hereby incorporated by reference. The reference voltage is simply a well-controlled voltage. Comparator 34 compares LATCH-P to the reference voltage. If LATCH-P rises to the reference voltage, it shuts down driver 36, thereby to prevent further rises in LATCH-P.

Thus, when the memory is operating at a power supply voltage of 4.5 volts, only 3.3 volts is supplied to the bit line for refreshing, because LATCH-P is limited to 3.3 volts. Likewise, when the memory is operating at a power supply voltage of 5.5 volts, still only 3.3 volts is supplied to the bit lines during refresh, because that is the maximum value of LATCH-P.

Figure 2:
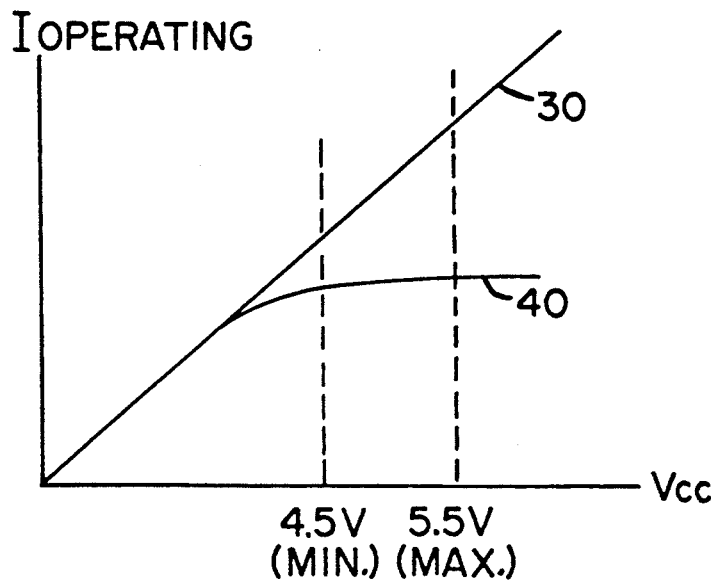
FIG. 2 represents a current-voltage curve comparing the present invention to the prior art.

Returning to FIG. 2, it will now be appreciated that in a memory constructed and operated in accordance with this invention, the power consumption at 4.5 volts and at 5.5 volts is approximately the same. As can be seen, curve 40, which represents the current consumed by using the present invention, is significantly lower at the maximum power supply voltage than the current consumed by the prior art circuit, represented by line 30. In both cases, the current consumed by the preferred embodiment is lower than the prior art, and this is despite the fact that large capacitance is used and voltage transition values rise.

I claim:

1. A method of decreasing power consumption in an integrated circuit DRAM having a specified minimum power supply voltage, and wherein transistors in said DRAM have threshold voltages, the DRAM having memory cells associated with bit lines to which voltages are applied during read and refresh operations, the method comprising:

limiting the bit line voltages for said read and refresh operations substantially to a value no higher than the minimum specified power supply voltage minus one said threshold voltage, said limiting step including comparing a reference signal to a drive signal applied to a sense amplifier coupled to one or more bit lines of the DRAM, and controlling the magnitude of the drive signal in response to said comparing step.

2. An integrated circuit DRAM having bit lines, memory cells, word lines, and a sense amplifier, wherein data is stored in a memory cell by a voltage stored on a storage capacitor in the memory cell, said DRAM further including a sense amplifier drive line coupled to the sense amplifier, a sense amplifier driver connected to provide a drive voltage to said sense amplifier drive line, and a drive line control circuit coupled to said sense amplifier driver;

said control circuit being effective to provide a comparison function between a reference voltage and the drive voltage so that the drive voltage applied to the sense amplifier is controlled in accordance with the comparison, the bit line voltages during write and refresh operations being thereby controlled so that the voltage corresponding to one datum is no greater than substantially a minimum specified power supply voltage minus one threshold voltage over the normal operating range of the DRAM.

3. An integrated circuit DRAM of the type including a sense amplifier coupled to a bit line, a word line, a memory cell disposed at or near the intersection of the word line and the bit line, wherein the improvement comprises:

means for generating a non-zero voltage lower than a power supply voltage ("VCC"), said means for generating including an input for receiving a reference signal substantially independent of the value of VCC; and means for applying said voltage to the bit lines for restoring or writing a datum value into the memory cell.

4. The DRAM of claim 3 wherein said means for generating further includes:

a voltage comparator having one input coupled to said means for applying and another voltage comparator input coupled to said input for receiving a voltage reference, and a driver circuit responsively coupled to an output of the comparator, the driver circuit providing said non-zero voltage.

5. The memory of claim 4 wherein said means for applying includes a conductor coupling said driver circuit directly or indirectly to the bit lines.

6. The memory of claim 5 wherein said conductor couples said driver circuit to the sense amplifier, said sense amplifier being coupled to said bit line.

7. A method of operating a DRAM comprising the steps of:

receiving a power supply voltage between a minimum value and a maximum value; and establishing a non-zero voltage lower than the minimum power supply voltage and writing no higher than said non-zero voltage as a logic "1", said establishing step including using a reference voltage to provide said non-zero voltage.

8. The method of claim 7 wherein said non-zero voltage substantially corresponds to the power supply voltage minimum value minus one threshold voltage.

9. The method of claim 7 wherein said method further comprises controlling the non-zero voltage so that the non-zero voltage does not follow changes in the power supply voltage and applying said non-zero voltage via the sense amplifier to the bit lines during refresh operations.

10. The method of claim 7 wherein said establishing step further includes comparing said reference voltage to a drive signal and using said drive signal in said writing step.

11. The method of claim 10 wherein said drive signal is a sense amplifier drive signal and wherein the method includes controlling a sense amplifier drive signal generator to generate said drive signal, said controlling step being based on said comparing step.

12. The method of claim 1 wherein said reference signal is a reference voltage signal substantially independent of the value of power supply voltage.

13. The method of claim 12 further including applying the drive signal to power a sense amplifier coupled to bit lines in the DRAM.

14. The method of claim 13 wherein said drive signal is applied to p channel transistors in the sense amplifier.

15. The method of claim 7 wherein said method further comprises controlling the non-zero voltage so that the non-zero voltage does not follow changes in the power supply voltage and applying said non-zero voltage to the sense amplifier during refresh operations.

16. The DRAM of claim 2 wherein said control circuit includes a comparator having first and second inputs, the reference voltage being applied to said first input, the sense amplifier drive line being coupled to said second input.

17. The DRAM of claim 16 wherein said comparator produces an output signal, said sense amplifier driver being responsively coupled to said comparator output signal.

* * * * *

UNITED STATES PATENT AND TRADEMARK OFFICE
CERTIFICATE OF CORRECTION

PATENT NO. : 5,317,538
DATED : May 31, 1994
INVENTOR(S) : S. Sheffield Eaton, Jr.

It is certified that error appears in the above-indentified patent and that said Letters Patent is hereby corrected as shown below:

On the title page, item [73] Assignee:
In the Assignee, list the assignees as follows:

-- United Memories, Inc., Colorado Springs, Colo. and Nippon Steel Semiconductor Co., Ltd., Japan --.

Signed and Sealed this

Eleventh Day of October, 1994

Attest:

BRUCE LEHMAN

*Attesting Officer*  *Commissioner of Patents and Trademarks*